United States Patent
Binz et al.

(10) Patent No.: US 6,523,362 B2
(45) Date of Patent: Feb. 25, 2003

(54) SUPPORT FOR COMPONENTS USED IN MICROSYSTEMS TECHNOLOGY

(75) Inventors: Dieter Binz, Hirschberg (DE); Albrecht Vogel, Stutensee (DE); Peter Krippner, Karlsruhe (DE)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 10/045,795

(22) Filed: Jan. 10, 2002

(65) Prior Publication Data
US 2002/0093805 A1 Jul. 18, 2002

(30) Foreign Application Priority Data
Jan. 9, 2001 (DE) .......................... 101 00 679

(51) Int. Cl.[7] .......................... H05K 7/20; H01L 23/12; F25D 23/12
(52) U.S. Cl. .......................... 62/259.2; 62/3.2; 361/704; 361/705; 361/707; 361/715; 257/704; 257/706; 257/701; 257/712; 257/713
(58) Field of Search .................. 62/259.2, 3.2; 257/714, 715, 62, 174, 165, 704, 706, 701, 712, 713, 433, 434; 361/704, 707, 715, 816, 818, 792, 793, 795, 794

(56) References Cited

U.S. PATENT DOCUMENTS

| | | | |
|---|---|---|---|
| 5,343,938 A | | 9/1994 | Schmidt |
| 5,475,775 A | * | 12/1995 | Kragl et al. .................. 385/14 |
| 5,574,806 A | * | 11/1996 | Kragl et al. .................. 385/14 |
| 5,846,852 A | * | 12/1998 | Limper-Brenner et al. . 438/118 |
| 5,867,513 A | * | 2/1999 | Sato ............................ 372/32 |
| 5,887,435 A | * | 3/1999 | Morton ........................ 62/3.6 |
| 5,963,697 A | * | 10/1999 | Kosugi ........................ 385/92 |
| 6,054,676 A | * | 4/2000 | Wall et al. ................... 219/209 |
| 6,181,718 B1 | * | 1/2001 | Kobayashi et al. ........... 372/34 |
| 6,307,590 B1 | * | 10/2001 | Yoshida ...................... 348/340 |
| 6,323,891 B1 | * | 11/2001 | Kitani et al. ................. 347/263 |
| 6,337,435 B1 | * | 1/2002 | Chu et al. ................... 136/242 |
| 6,345,917 B2 | * | 2/2002 | Tatoh ......................... 385/94 |
| 6,351,194 B2 | * | 2/2002 | Takahashi et al. .......... 333/133 |

FOREIGN PATENT DOCUMENTS

| | | |
|---|---|---|
| DE | 270 180 A1 | 7/1989 |
| DE | 287 810 A5 | 3/1991 |
| DE | 42 38 417 A1 | 5/1993 |
| EP | 0 514 873 A1 | 11/1992 |
| JP | 00 101 000 A | 4/2000 |

OTHER PUBLICATIONS

M.S. Mansuria et al.: "Thermo–Electrically Cooled Tape Automated Bonding Chip Pin–Grid–Array Package", IBM Technical Disclosure Bulletin, vol. 34, No. 3, Aug. 1991, pp. 359–360.

Gerhard Meyer: "Temperaturstabilisierung mit Peltier–Element: Laserdioden–Eigenschaften unter Kontrolle" [temperature stabilization with Peltier element: laser diode characteristics under control], Elektronik, No. 14, Jul. 10, 1987, pp. 82–84.

* cited by examiner

*Primary Examiner*—Jayprakash N. Gandhi
*Assistant Examiner*—Phuong T. Vu
(74) *Attorney, Agent, or Firm*—Laurence A. Greenberg; Werner H. Stemer; Gregory L. Mayback

(57) ABSTRACT

A support element is described which can combine components used in Microsystems technology to form a single unit. Because of the very small dimensions of the support element, it is difficult to keep the components at different temperatures if this is required for them to operate. With the support element, this difficulty is avoided by the fact that at least one thermal insulation device, which shields the plate and the cover of the support element with respect to internal and external environments in certain regions, is provided.

9 Claims, 5 Drawing Sheets

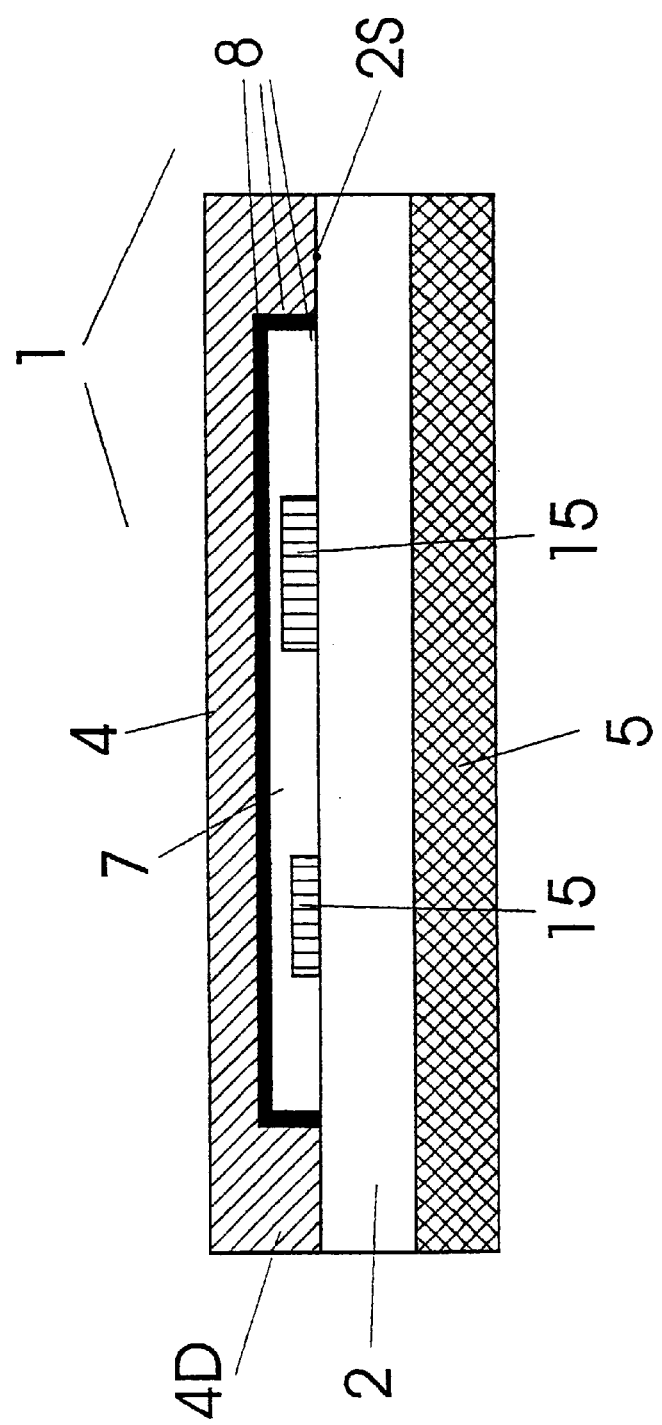

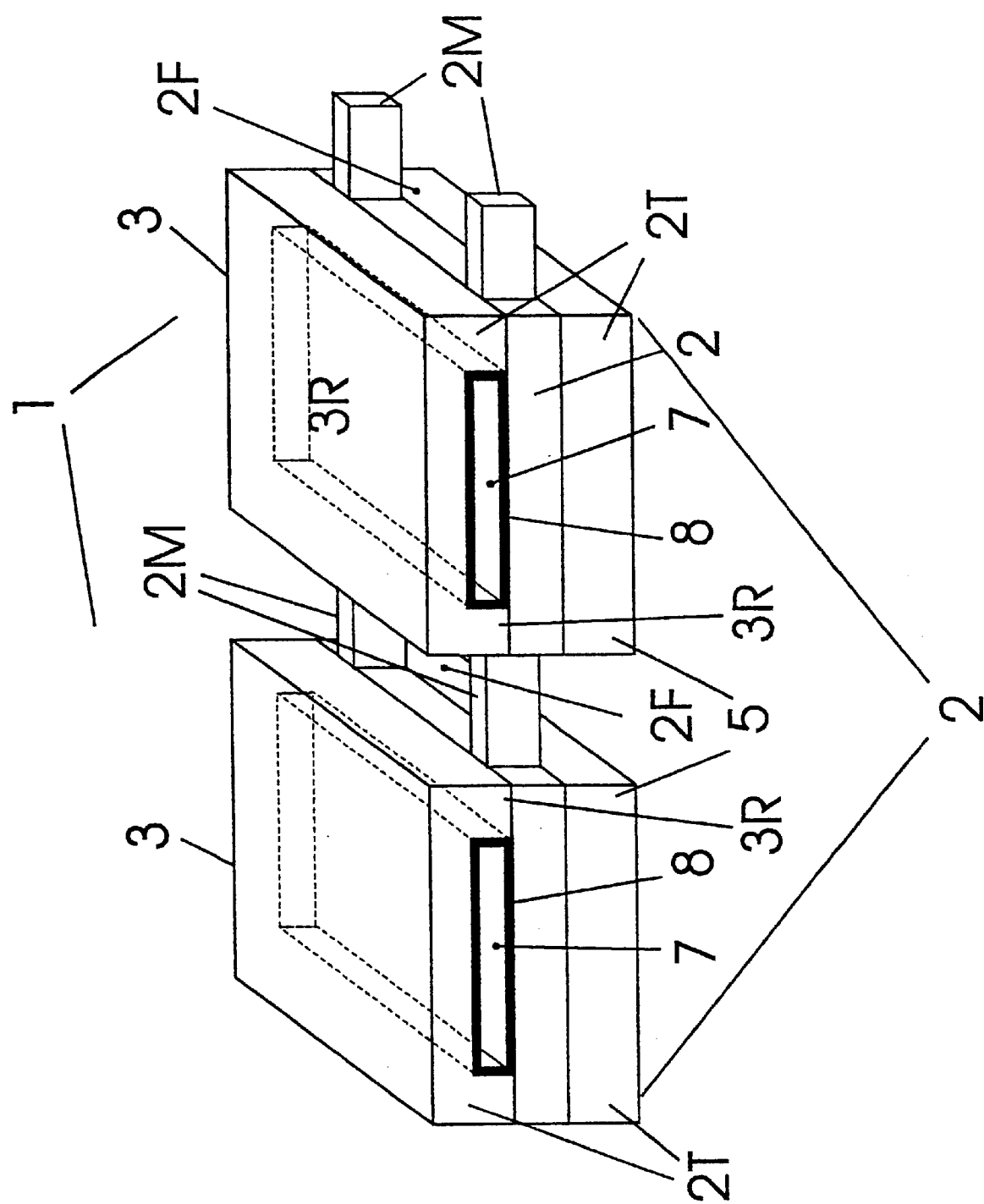

SUPPORT FOR COMPONENTS USED IN MICROSYSTEMS TECHNOLOGY

BACKGROUND OF THE INVENTION

Field of the Invention

The invention relates to a support element for components used in microsystems technology. The support element has at least one plate for receiving components and a cover for shielding the components with respect to the external environment.

Support elements of this type are used primarily where a multiplicity of components of very small dimensions are combined to form a single unit and are to be held at defined temperature levels.

The support elements that are currently known have plates which, if appropriate, are provided with recesses. The components are disposed on the surfaces of the plates or in the recesses. On account of the small dimensions of the plates and the associated space restrictions on the surfaces of the plates and in their recesses, it is difficult to insulate individual components from one another. Therefore, it is necessary to accept a significantly increased energy consumption for temperature control. Moreover, heat is lost to the environment of the support elements. An excessively warm environment of the support elements also influences processes that require cooling of the components.

SUMMARY OF THE INVENTION

It is accordingly an object of the invention to provide a support for components used in Microsystems technology which overcomes the above-mentioned disadvantages of the prior art devices of this general type, which enables a multiplicity of components to be held at predetermined temperatures for a prolonged period.

With the foregoing and other objects in view there is provided, in accordance with the invention, a support element. The support element contains at least one plate for receiving components used in microsystems technology, a cover disposed above the plate and shielding the components with respect to an external environment, and at least one thermal insulation device for shielding the plate and the cover with respect to the external and internal environments in certain regions.

The inventive configuration of the support element enables components that are disposed on the plate of the support element or in its recesses to be cooled or heated over a prolonged period without the components influencing one another. In particular, the cooling of the components with the aid of Peltier elements is improved. At the same time, energy that has to be supplied for heating and cooling is reduced; this is advantageous in particular for portable, battery-operated equipment.

In accordance with an added feature of the invention, the thermal insulation device has an additional covering surrounding the cover at a predetermined distance and is connected to the cover in a gas-tight manner. The additional covering has an evacuated cavity formed therein and is defined by inner surfaces. The evacuated cavity is formed adjacent to the cover and the cover defines one of the inner surfaces of the evacuated cavity. The thermal insulation device further has a reflective metallic coating disposed on the inner surfaces of the evacuated cavity. The thermal insulation device additionally has a part for at least one of heating and cooling disposed at least on an underside of the plate. The part can be a temperature-control module such as a Peltier element, a heater block or a heater coil disposed at least on an underside of the plate.

In accordance with another feature of the invention, the plate is one of a plurality of plates and each of the plates is divided into two or more regions, and webs connect the regions to each other. The webs are made from a load-bearing, thermally insulating material.

In accordance with an additional feature of the invention, the plate has at least two regions and webs connecting the regions to one another, the webs being made from a load-bearing, thermally insulating material.

With the foregoing and other objects in view there is further provided, in accordance with the invention, a support element. The support element contains at least one plate for receiving components used in Microsystems technology, and a covering serving as a cover for shielding the components. The covering has an edge facing the plate. The edge of the covering is fitted on the edge of the plate and is connected to the plate in the gas-tight manner. The covering has an evacuated cavity formed therein and defined by inner surfaces. The evacuated cavity is formed adjacent to the plate and the plate defines one of the inner surfaces of the evacuated cavity. A reflective metallic coating, such as Au, Ag or Al, is applied to the inner surfaces of the evacuated cavity. A temperature-control module, such as a Peltier element and/or a heater block, is disposed at least on an underside of the plate.

Other features which are considered as characteristic for the invention are set forth in the appended claims.

Although the invention is illustrated and described herein as embodied in a support for components used in microsystems technology, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a sectional view of a variant of the support element illustrated in FIG. 1; and FIG. 5 is a perspective view of the support element with a divided plate.

DESCRIPTION OF THE PREFERRED EMBODIMENTS

Figure 1:
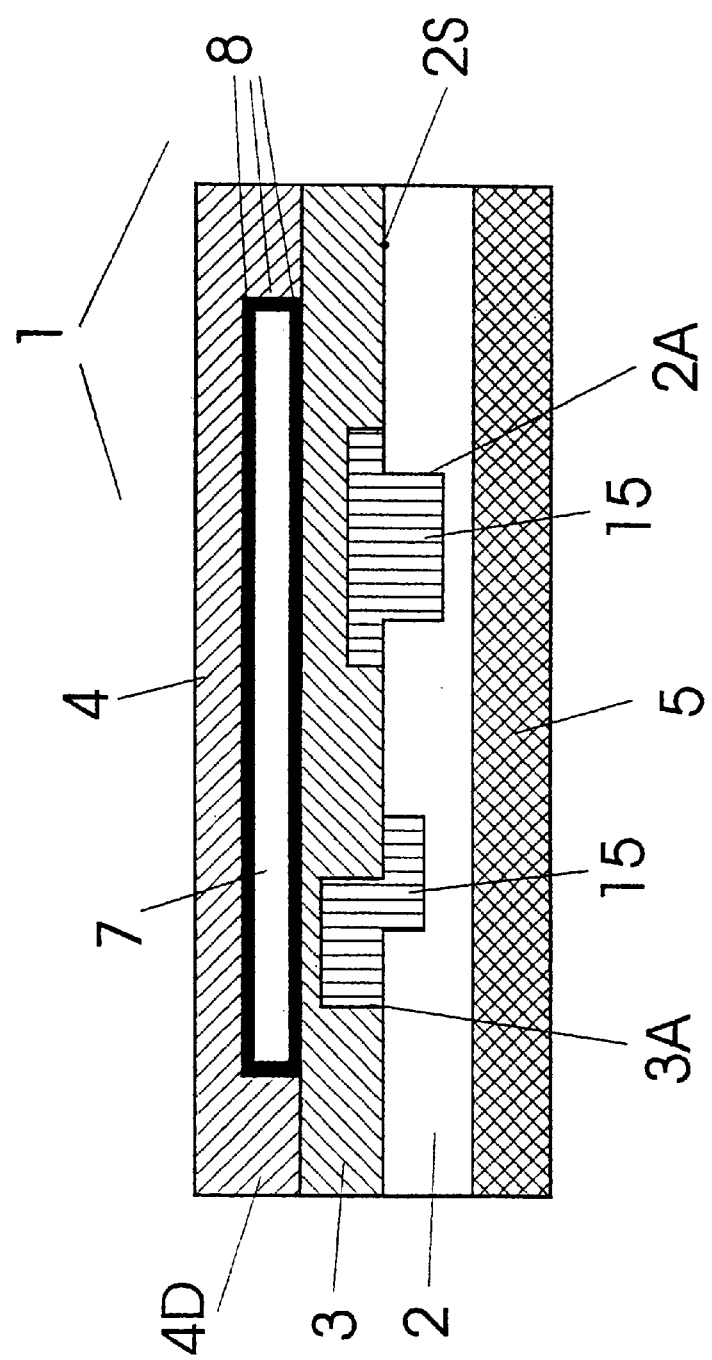
FIG. 1 is a diagrammatic, sectional view of a support element for receiving components used in Microsystems technology according to the invention.

Referring now to the figures of the drawing in detail and first, particularly, to FIG. 1 thereof, there is shown a support element 1 that is substantially formed by a plate 2, a cover 3, a covering 4 and a part 5. The part 5 is a temperature-control module 5, which is configured either as a Peltier element 5 or as a heater block 5. The plate 2 is made from silicon or glass. Recesses 2A, which are intended to receive components 15 used in Microsystems technology, are formed in a surface 2S of the plate 2. However, it is also possible for the component 15 to be disposed on the surface 2S of the support element 1. The cover 3, which is of a large-area configuration, is used to shield the components 15 with respect to the external environment. The cover 3 is of the same size as the surface of the plate 2. It is laid on top of the latter and is connected thereto in a gas-tight manner. At the locations at which the components 15 are disposed directly on the surface 2S of the plate 2, the cover 3 is likewise provided with recesses 3A, into which the components 15 project. The cover 3 is made from glass or silicon. To ensure that the components 15 are fully functional, they in some cases have to be cooled or heated. To avoid heat losses or to prevent heat from the environment from acting on cooled components 15, insulation measures are provided. For this purpose, according to the invention the cover 3 is provided with the covering 4, the size of which is matched to the size of the cover 3. The covering 4 is made from silicon or glass. The covering 4 is provided all the way around with an edge 4D that faces the cover 3. By use of the edge 4D, it is fitted onto the edge of the cover 3 and is connected to the cover 3 in a gas-tight manner. The edge 4D creates a cavity 7, which is evacuated, between the cover 3 and the covering 4. The surfaces that delimit the cavity 7 on the inside are covered with a reflective metallic coating 8, which preferably consists of Au, Ag or Al.

To enable the components 15 to be heated and/or cooled, the underside of the plate 2 is connected, with good thermal conductivity, to the temperature-control module 5. In the exemplary embodiment illustrated here, it is of the same size as the plate 2. If necessary, it may also be smaller, so that it can be disposed on the underside of the plate 2 directly beneath the component 15. If the components 15 only have to be heated, a temperature-control module 5 that is configured as a heater block is used.

Figure 2:
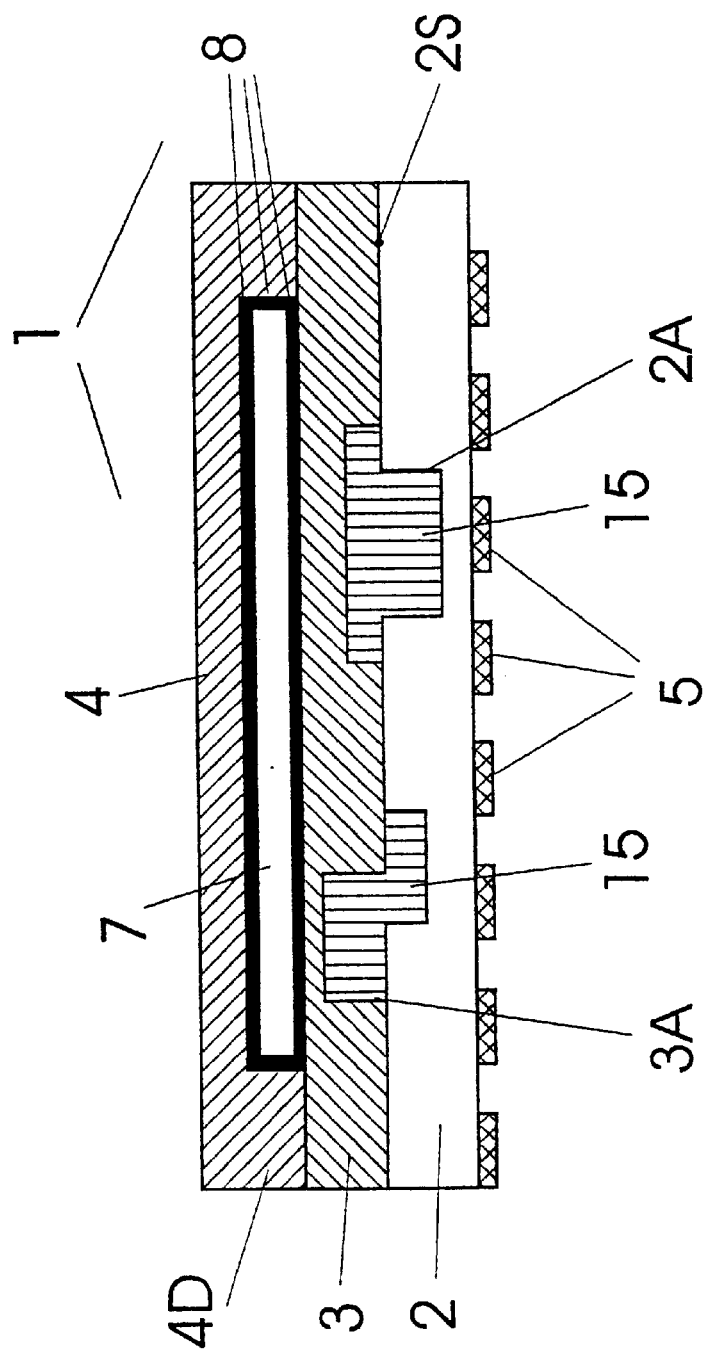
FIG. 2 is a sectional view of a variant of the support element illustrated in FIG. 1.

The support element 1 illustrated in FIG. 2 differs from the support element 1 which is shown in FIG. 1 and is explained in the associated drawing only with regard to the configuration of the part 5. Therefore, identical parts are provided with the same reference numerals. All that is disposed underneath the plate 2 is the part 5, which is configured as a heater coil 5. The heater coil 5 of this type is sufficient if the components 15 are only to be held at a temperature which is higher than the ambient temperature. The heater coil 5 may be formed by a coating, which is only a few micrometres thick, on the underside of the plate 2. This may be a conductor track structure that is applied using the screen-printing technique to and serves as a resistance heater.

Figure 3:
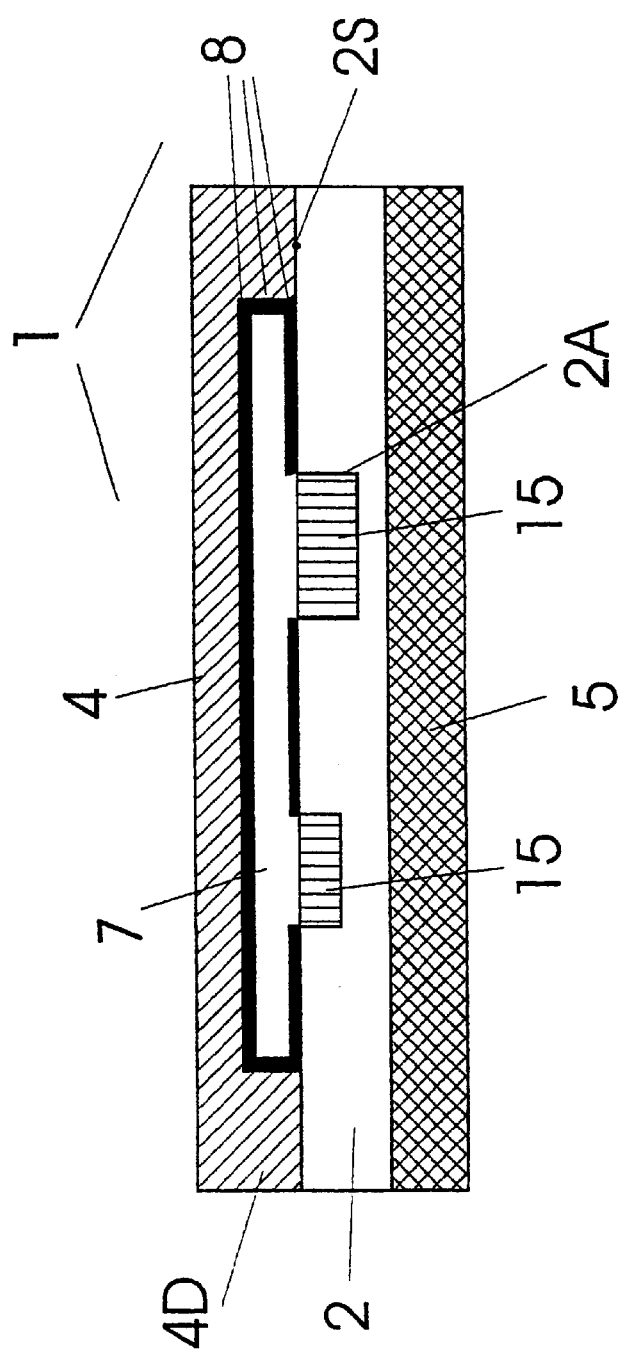
FIG. 3 is a sectional view of a simplified embodiment of the support element illustrated in FIG. 1.

FIG. 3 shows a simplified embodiment of the support element 1 illustrated in FIG. 1. The support element 1 is provided only with the plate 2, the covering 4 that performs the function of the cover 3 and the temperature-control module 5. This embodiment of the support element 1 can be used when components 15 that are able to function fully even if they are disposed in an evacuated space are used. In this case, the components 15 are disposed in recesses 2A in the plate 2. The covering 4 at the same time serves as the cover, so that the cover 3 can be dispensed with. The covering 4 is of the same size as the surface 2S of the plate 2. It is configured in the same way as the covering 4 that is illustrated in FIG. 1 and explained in the associated description. The covering 4 is supported on the edge of the plate 2 by its edge 4D and is connected to the plate 2 in a gas-tight manner by the edge.

The cavity 7 between the plate 2 and the covering 4 is evacuated. The inner surfaces of the covering 4 and the regions of the surface 2S of the plate 2 which do not have any recesses 2A are covered with the reflective metallic coating 8 of Au, Ag, Al, which in this case is applied to the inner surfaces of the covering 4 and the surface 2S of the plate 2 by vapor deposition. The temperature-control module 5 which is configured as a Peltier element or as a heater block is disposed on the underside of the plate 2. To heat the components 15, it is sufficient if only one heater coil is disposed on the underside of the plate 2, as illustrated in FIG. 2 and explained in the associated description.

FIG. 4 shows the support element 1 that is of substantially the same construction as the support element 1 illustrated in FIG. 3 and explained in the associated description. Therefore, identical components are provided with the same reference numerals. The embodiment of the support element 1 can likewise only be used if components 15 that remain fully able to function even if they are disposed in an evacuated space are used. The difference between the support elements 1 shown in FIG. 3 and 4 consists in the fact that the components 15 are in this case disposed on the surface of the plate 2. In this case too, the covering 4 acts as the cover, so that the latter can be dispensed with in this case. The distance between the plate 2 and the covering 4 is sufficiently great for sufficient space for the components 15 to remain in the cavity 7. The inner surfaces of the covering 4 are covered with a reflective metallic coating 8 made from Au, Ag, Al. The temperature-control module 5, which is configured as a Peltier element or as a heater block, is disposed on the underside of the plate 2. As heating for the components 15 it may be sufficient if only the heater coil 5 is disposed on the underside of the plate 2, as illustrated in FIG. 2 and explained in the associated description.

FIG. 5 shows the support element 1 in which the plate 2 is divided into a plurality of regions 2T. For this purpose, gaps 2F running perpendicular to the longitudinal axis of the plate 2 are formed at defined intervals. The plate 2 is not completely severed, but rather at least two webs 2M, which are oriented parallel to the longitudinal axis of the plate 2 and are at a predetermined distance from one another, are formed in each gap 2F. The width of the webs 2M is such that the load-bearing capacity of the support element 1 is retained. In this case, it should be ensured that no recesses are formed in the immediate vicinity of the webs 2M, in the regions 2T. The plate 2 therefore has regions 2T which are thermally insulated from one another, so that components which are to be cooled can be disposed in one region 2T, and components which have to be heated can be disposed in the immediately adjacent region 2T, without the components influencing one another.

The components are disposed in recesses which are formed in the surfaces of the regions 2T. Temperature-control modules 5 are installed on the outside of the underside of the regions 2T. The cover 3 is provided with edges 3R that are supported on the regions 2T of the plate 2 and are connected to their surfaces in a gas-tight manner. The cavities 7, which are partially delimited by the edges 3R of the cover 3, are also formed between the cover 3 and the regions 2T. The cavities are evacuated. The metallic, reflective coating 8 of Au, Ag or Al is applied to each of the inner surfaces of the cavity 7.

It is also possible for a plurality of individual plates 2 that are of the same size as the regions 2T to be connected, via webs 2M, in the same way as that described above. In this case, the webs 2M are produced as a load-bearing and, at the same time, thermally insulating material, so that the thermal conductivity between the regions 2T is reduced still further. The remaining part of the support element 1 is configured in the same way as that described above.

We claim:

1. A support element, comprising:
   at least one plate for receiving components used in microsystems technology;
   a cover disposed above said plate and shielding the components with respect to an external environment; and
   at least one thermal insulation device for shielding said plate and said cover with respect to the external environment and an internal environment in certain regions, said thermal insulation device has an additional covering surrounding said cover at a predetermined distance and is connected to said cover in a gas-tight manner, said additional covering having an evacuated cavity formed therein and defined by inner surfaces, said evacuated cavity being formed adjacent to said cover and said cover defining one of said inner surfaces of said evacuated cavity.

2. The support element according to claim 1, wherein:
   said thermal insulation device has a reflective metallic coating disposed on said inner surfaces of said evacuated cavity and a part for at least one of heating and cooling disposed at least on an underside of said plate.

3. The support element according to claim 1, wherein:
   said thermal insulation device has a reflective metallic coating selected from the group consisting of Au, Ag and Al and disposed along said inner surfaces of said evacuated cavity; and
   said thermal insulation device has a temperature-control module selected from the group consisting of a Peltier element and a heater block, and is disposed at least on an underside of said plate.

4. The support element according to claim 1, wherein:
   said thermal insulation device has a reflective metallic coating selected from the group consisting of Au, Ag and Al, and disposed along said inner surfaces defining said evacuated cavity; and
   said thermal insulation device has a heater coil disposed at least on an underside of said plate.

5. The support element according to claim 1, wherein said plate is one of a plurality of plates and each of said plates is divided into two or more regions, and including webs connecting said regions to each other.

6. The support element according to claim 5, wherein said webs are made from a load-bearing, thermally insulating material.

7. The support element according to claim 1, wherein said plate has at least two regions and has webs connecting said regions to one another, said webs being made from a load-bearing, thermally insulating material.

8. A support element, comprising:
   at least one plate for receiving components used in microsystems technology and having an edge;
   a cover disposed above said plate and shielding the components with respect to an external environment;
   an additional covering an edge facing said cover, said edge of said covering fitted on said edge of said cover and connected to said cover in said gas-tight manner, said covering having an evacuated cavity formed therein and defined by inner surfaces, said evacuated cavity being formed adjacent to said cover and said cover defining one of said inner surfaces of said evacuated cavity;
   a reflective metallic coating, selected from the group consisting of Au, Ag and Al, applied to said inner surfaces of said evacuated cavity; and
   a temperature-control module, selected from the group consisting of a Peltier element and a heater block, disposed
   at least on an underside of said plate.

9. A support element, comprising:
   at least one plate for receiving components used in microsystems technology and having-an edge; a cover disposed above said plate and shielding the components with respect to an external environment;
   an additional covering serving having an edge facing said cover, said edge of said covering fitted on said edge of said cover and connected to said cover in said gas-tight manner, said covering having an evacuated cavity formed therein and defined by inner surfaces, said evacuated cavity being formed adjacent to said cover and said cover defining one of said inner surfaces of said evacuated cavity;
   a reflective metallic coating, selected from the group consisting of Au, Ag and Al, disposed at least in a region of said inner surfaces defined by said covering; and
   a temperature-control module, selected from the group consisting of a Peltier element and a heater block, disposed at least on an underside of said plate.

* * * * *